United States Patent
Zheng et al.

(10) Patent No.: US 11,046,607 B2
(45) Date of Patent: Jun. 29, 2021

(54) METHOD TO REDUCE DARKENING IN PHOSPHOR IN GLASS (PIG) MADE BY SPS

(71) Applicant: OSRAM Opto Semiconductors GmbH, Regensburg (DE)

(72) Inventors: Yi Zheng, Lynnfield, MA (US); Victor E. Perez, Lawrence, MA (US)

(73) Assignee: OSRAM Opto Semiconductors GmbH, Regensburg (DE)

(*) Notice: Subject to any disclaimer, the term of this patent is extended or adjusted under 35 U.S.C. 154(b) by 312 days.

(21) Appl. No.: 16/269,443

(22) Filed: Feb. 6, 2019

(65) Prior Publication Data
US 2020/0247704 A1    Aug. 6, 2020

(51) Int. Cl.
| | | |
|---|---|---|
| C03B 19/01 | (2006.01) | |
| C09K 11/02 | (2006.01) | |
| C09K 11/77 | (2006.01) | |
| H01L 33/50 | (2010.01) | |
| C03C 4/12 | (2006.01) | |

(52) U.S. Cl.
CPC ............ *C03B 19/01* (2013.01); *C09K 11/025* (2013.01); *C09K 11/7774* (2013.01); *H01L 33/501* (2013.01); *H01L 33/507* (2013.01); *C03B 2201/10* (2013.01); *C03B 2201/23* (2013.01); *C03B 2201/32* (2013.01); *C03B 2201/34* (2013.01); *C03C 4/12* (2013.01)

(58) Field of Classification Search
CPC ......... C03B 19/01; C03C 4/12; H01L 33/501; C09K 11/025; C09K 11/7774
See application file for complete search history.

(56) References Cited

U.S. PATENT DOCUMENTS

| | | | |
|---|---|---|---|
| 3,954,656 A | 5/1976 | Deeg et al. | |
| 7,963,817 B2 * | 6/2011 | Kameshima | .......... C03C 14/004 445/24 |
| 2017/0365743 A1 | 12/2017 | You et al. | |

FOREIGN PATENT DOCUMENTS

| | | |
|---|---|---|
| JP | 2017149929 A | 8/2017 |
| WO | 2016209871 A1 | 12/2016 |
| WO | WO 2016/209871 | * 12/2016 |

OTHER PUBLICATIONS

Bertrand, A., et al., "A Comprehensive Study of the Carbon Contamination in Tellurite Glasses and Glass-Ceramics-Sintered by Spark Plasma Sintering (SPS)," Journal of the American Ceramic Society, vol. 97, Issue 1, Dec. 6, 2013, pp. 163-172.

* cited by examiner

*Primary Examiner* — C Melissa Koslow
(74) *Attorney, Agent, or Firm* — Slater Matsil, LLP (57) ABSTRACT

A method for preparing a glass composite wavelength converter comprising the steps of providing at least one phosphor material, providing a powder of glass components, mixing the phosphor material and the powder of glass components, thereby preparing a first mixture, adding at least one oxidizing agent to the first mixture, mixing the oxidizing agent with the first mixture, thereby preparing a second mixture, applying pressure and current to the second mixture, thereby preparing a glass composite wavelength converter is described. Furthermore, a glass component wavelength converter and a light source are described.

20 Claims, 5 Drawing Sheets

METHOD TO REDUCE DARKENING IN PHOSPHOR IN GLASS (PIG) MADE BY SPS

TECHNICAL FIELD

This invention relates to a method for producing a glass wavelength converter, a glass wavelength converter and a light source comprising said glass wavelength converter. The glass wavelength converter is preferably a so-called phosphor-in-glass (PiG) wavelength converter.

BACKGROUND

There are several approaches for preparing phosphor wavelength converter materials. In the manufacture of conventional phosphor conversion light emitting diodes (pc-LEDs), phosphor powders are normally mixed with a polymer material, such as a silicone or epoxy resin, to generate a homogenous dispersion of the phosphor particulates in the resin. The phosphor-polymer mixtures are then cast, deposited or coated on a blue-emitting (or near-ultraviolet-emitting) LED chip in a LED package. The phosphor-polymer mixture approach is easily implemented in LED packages, but often suffers from the instability of the polymer materials which degrade under high temperatures and light intensities.

A further way to create a pc-LED is to use a ceramic wavelength converter. The ceramic wavelength converters are formed by sintering a mass of inorganic phosphor particles at high temperature until the particles diffuse and stick together to form a monolithic piece. The ceramic converter is typically formed as a thin rectangular platelet that is applied to the light emitting surface of the LED chip. Because of their higher thermal conductivity, ceramic wavelength converters are preferred in higher power applications over converters that are formed from dispersions of phosphor particles in epoxy or silicone resins. However, while this approach offers better stability, it can be relatively more expensive to the manufacture.

The phosphor-in-glass (PiG) approach is somewhere in between these two approaches. It has the flexibility of the phosphor-polymer approach and offers the better stability of the ceramic converter approach at a lower cost. Typically phosphor-in-glass approaches require the glass to soften or melt to assure the homogeneity of phosphor dispersion and reduce or eliminate porosity in the converter. However, because of the temperatures and duration times used in these processes, the possibility of damaging the phosphor is increased. This is less a concern for oxide-based phosphors, such as cerium doped yttrium aluminum garnet phosphors, as these are less sensitive to such processing conditions. However, the damage to nitride-based phosphors can be severe, particularly because nitride-based phosphors are very sensitive to oxygen impurities and most glasses are oxide glasses, an abundant source for oxygen.

The PiG is used in LED packages. It can absorb all or partial of excitation light, such as blue or near UV light, from a LED chip and convert it to the light with another wavelength. One way to make PiG samples is using spark plasma sintering (SPS). There are some advantages compared to other conventional pressureless sintering of PiG. First, SPS of PiG is processed at temperature much lower than pressureless sintering due to additional pressure applied. So there will be less damage to the phosphors used in PiG. Secondly, PiG by SPS can have less porosity, again due to the applied pressure. Due to these advantages, PiG by SPS can have better performance than the PiG by pressureless sintering.

But during SPS of a glass powder process, some glasses show a darkening. There are two possible sources of this darkening. During a SPS process, the samples are in contact with graphite die and foil used in the manufacture assembly. Although a BN protection coating was deposited on inner side of dies and foil, there still could be some darkening caused by the graphite contamination. The second possible reason for darkening is the reduced atmosphere used in the SPS process. During the SPS process, carbon being present in parts of the manufacture assembly could react with residual oxygen in the SPS chamber. The reaction products of said reaction could be CO or $CO_2$. The gaseous CO and $CO_2$ can diffuse into samples and can be trapped inside pores of the sample. When temperature and pressure increase, the reaction according to equation (1) could happen.

$$2\ CO(g) \rightarrow CO_2(g) + C \quad (1)$$

The carbon particles trapped inside the pores give a darkening color. In addition, the CO could also reduce metal ions in the glass to metal elements and cause darkening.

"A Comprehensive Study of the Carbon Contamination in Tellurite Glasses and Glass-Ceramics Sintered by Spark Plasma Sintering (SPS)" is disclosed in J. Am. Ceram. Soc., 97 [1] 163-172 (2013).

WO 2016/209871 discloses glass composite wavelength converters being prepared by spark plasma sintering.

SUMMARY

It is an object of the invention to obviate the disadvantages of the prior art. Preferably a method of the present invention would significantly reduce the darkening in PiG samples and thus increase the efficacy of PiG samples.

It is a further object of the present invention to provide a method for preparing a glass composite wavelength converter.

It is also an object of the present invention to provide a glass composite wavelength converter prepared by a method of the present invention.

It is also an object of the present invention to provide a light source comprising a glass composite wavelength converter prepared by a method of the present invention.

In accordance with one object of the present invention, there is provided a method for preparing a glass composite wavelength converter comprising the steps of:
providing at least one phosphor material,
providing a powder of glass components,
mixing the phosphor material and the powder of glass components, thereby preparing a first mixture,
adding at least one oxidizing agent to the first mixture,
mixing the oxidizing agent with the first mixture, thereby preparing a second mixture,
applying pressure and current to the second mixture,
thereby preparing a glass composite wavelength converter.

In accordance with another object of the present invention, there is provided a glass composite wavelength converter prepared by a method of the present invention.

In accordance with another object of the present invention, there is provided a light source comprising:
a light emitting diode (LED) that emits a primary light; and
a glass composite wavelength converter prepared by a method comprising the steps of:
providing at least one phosphor material,
providing a powder of glass components, mixing the phosphor material and the powder of glass components, thereby preparing a first mixture, adding at least one oxidizing agent to the first mixture, mixing the oxidizing agent with the first mixture, thereby preparing a second mixture, applying pressure and current to the second mixture, thereby preparing a glass composite wavelength converter, wherein the phosphor material converts at least a portion of the primary light into a secondary light.

BRIEF DESCRIPTION OF THE DRAWINGS

The invention is explained in more detail below on the basis of the examples and with reference to the associated figures. The figures are diagrammatic and do not represent illustrations that are true to scale.

DETAILED DESCRIPTION OF ILLUSTRATIVE EMBODIMENTS

For a better understanding of the present invention, together with other and further objects, advantages and capabilities thereof, reference is made to the following disclosure and appended claims taken in conjunction with the above-described drawings.

References to the color of the phosphor, LED, or conversion material refer generally to its emission color unless otherwise specified. Thus, a blue LED emits a blue light, a yellow phosphor emits a yellow light and so on.

Figure 4:
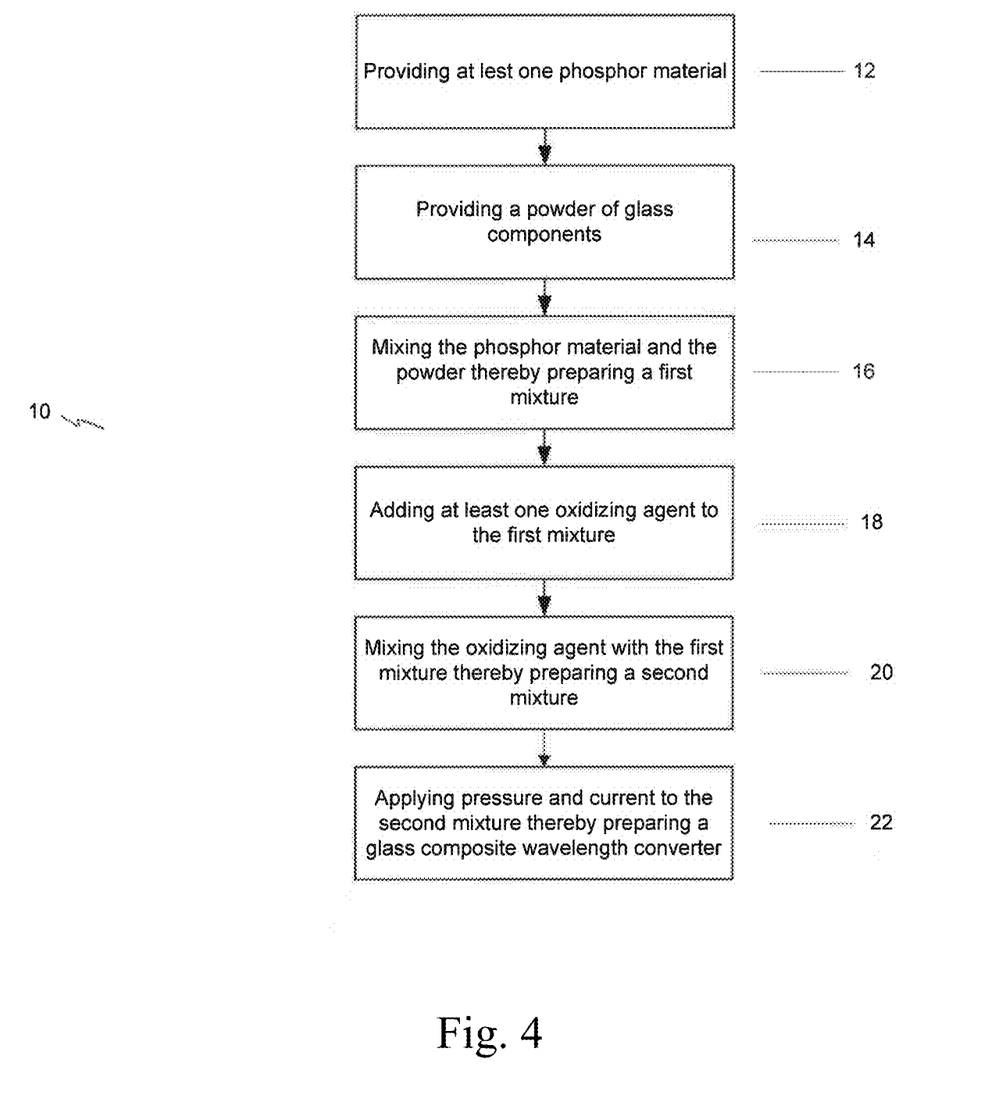
FIG. 4 represents a method of preparing a glass composite wavelength converter.

The present invention is directed to a method 10 for preparing a glass composite wavelength converter, as shown in FIG. 4, comprising the steps of:

providing at least one phosphor material 12, providing a powder of glass components 14, mixing the phosphor material and the powder of glass components, thereby preparing a first mixture 16, adding at least one oxidizing agent to the first mixture 18, mixing the oxidizing agent with the first mixture, thereby preparing a second mixture 20, applying pressure and current to the second mixture 22, thereby preparing a glass composite wavelength converter.

As used herein, a wavelength converter is a solid structure that converts at least part of light of a certain first wavelength to light of a certain second wavelength.

According to the present invention, the method comprises the step of providing at least one phosphor material. A phosphor is a material that converts light of a certain first wavelength to light of a certain second wavelength.

In an embodiment of the present invention, the phosphor material may be an oxide-based phosphor, or a nitride-based phosphor. Oxide-based phosphors may include cerium-activated garnet phosphors which may be represented by the formula $A_3B_5O_{12}$:Ce, wherein A is Y, Sc, La, Gd, Lu, or Tb and B is Al, Ga or Sc. More preferably, the oxide-based phosphor is at least one of $Y_3Al_5O_{12}$:Ce (abbr. YAG:Ce), $(Y,Gd)_3Al_5O_{12}$:Ce (abbr. YGdAG:Ce), and $Lu_3Al_5O_{12}$:Ce (abbr. LuAG:Ce). Examples of nitride-based phosphors include MAlSiN$_3$:Eu, wherein M is selected from Ca, Sr, and Ba, and $M_2Si_5N_8$:Eu, wherein M is selected from Ca, Sr, and Ba. Other possible phosphors include oxynitride phosphors such as $MSi_2O_2N_2$:Eu, wherein M is selected from Ca, Sr, and Ba, and silicate phosphors such as $BaMgSi_4O_4$:Eu and $M_2SiO_4$:Eu, wherein M is selected from Ca, Sr, and Ba.

In a preferred embodiment, the phosphor material is a red phosphor, and even more preferably a red narrow band phosphor. Red phosphors are important for generating a warm white color and a high color rendering index in phosphor-converted LEDs. They can also be used for full conversion red LEDs where red phosphors absorb all the blue/UV light from the LED chip and convert it to a red emission. Examples of red phosphors are MAlSiN$_3$:Eu, wherein M is selected from Ca, Sr, and Ba, and $M_2Si_5N_8$:Eu, wherein M is selected from Ca, Sr, and Ba.

Further preferred phosphor materials are YAG:Ce, e.g., for cool white LEDs, YAG:Ce and MAlSiN$_3$:Eu e.g for warm white LEDs, wherein M is selected from Ca, Sr, and Ba.

The phosphor material may be present as a pure material, or may be present as a mixture of at least two different phosphor materials.

The phosphor material may be present in an amount of about 10 wt. % to about 50 wt. %, preferably of about 15 wt. % to about 30 wt. % with respect to the second mixture. The exact amount of phosphor needed may be dependent on the type of phosphor (e.g., the kind and/or concentration of the activator in the phosphor), the final sample thickness and/or the target color bin.

The method of the present invention further comprises the step of mixing the phosphor material and a powder of glass components, thereby preparing a first mixture.

The powder of the glass components may have a particulate size of about 1 μm to about 40 μm. In an embodiment, the powder of the glass components has a particulate size of about 3 μm to about 5 μm.

In an embodiment of the present invention, the glass components have a glass transition temperature of less than about 600° C. In a further embodiment of the present invention, the glass components have a glass transition temperature of less than about 400° C. In a further embodiment of the present invention, the glass components have a glass transition temperature of less than about 300° C.

The glass components may be selected from the group consisting of RO—$B_2O_3$—$Al_2O_3$—$SiO_2$, RO—$B_2O_3$—$SiO_2$, or RO—$P_2O_5$, wherein R is selected from Mg, Ca, Sr, Ba, Zn and Sn.

The glass components should be selected in that way that it leads to a substantial transparent glass. Substantial transparent glass means that the glass preferably transmits at least about 80%, more preferably at least about 90%, or even more preferably at least about 95% of the primary and secondary light. The glasses should preferably be resistant to devitrification. E.g., if they easily devitrify during the manufacturing process, the formed crystalline phases may act as scattering/absorption centers, resulting to a light loss. It is also preferred that the glasses be humidity and weather resistant.

In an embodiment, the phosphor material may be YAG:Ce and the glass components may be RO—$B_2O_3$—$Al_2O_3$—$SiO_2$, wherein R is selected from alkali earth metal Mg, Ca, Sr and Ba. In an alternative embodiment, the phosphor materials are YAG:Ce and MAlSiN$_3$:Eu and the glass components are RO—$P_2O_5$, wherein M is selected from Ca, Sr, and Ba and R is selected from Zn, Sn, Mg, Ca, Sr and Ba.

In a further step of the method according to the present invention, an oxidizing agent is added to the first mixture comprising a phosphor material and a powder of glass components. The oxidizing agent, the phosphor material and the glass components may also be mixed in one step and not in a consecutive way. E.g., it is also possible that the oxidizing agent is provided and the phosphor material and the glass components are added.

In an embodiment of the present invention, the oxidizing agent is selected from the group consisting of $NaNO_3$, $LNO_3$, $LiNO_3$, $Na_2SO_3$, $K_2SO_3$, $Li_2SO_3$, and $K_2MnO_4$.

As mentioned above, the darkening in glass during SPS sintering is caused by a reduced atmosphere containing CO. Adding some oxidizing agent into the powders of glass components should help reduce darkening by oxidizing CO into $CO_2$. So if the reaction (1) doesn't occur, then no carbon will be trapped inside the glass, or no metal ions will be reduced to elemental metal.

E.g., when using $NaNO_3$ as oxidizing agent, the $NaNO_3$ can be decomposed during the method of the present invention, e.g., during SPS sintering. One of the byproducts is $O_2$, which can oxidize CO into $CO_2$ and thereby reduce the darkening in the final product.

$NaNO_3$ might decompose as follows:

$$2\ NaNO_3 \rightarrow 2\ NaNO_2 + O_2 \quad (2)$$

$$2\ NaNO_3 \rightarrow Na_2O + 3/2\ O_2 + 2NO \quad (3)$$

In an embodiment, the oxidizing agent is added to the first mixture in an amount of less than about 3 wt. % based on the amount of the second mixture. In an alternative embodiment, the oxidizing agent is added to the first mixture in an amount of less than about 2 wt. % based on the amount of the second mixture. In an alternative embodiment, the oxidizing agent is added to the first mixture in an amount of less than about 1 wt. % based on the amount of the second mixture. In a further alternative embodiment, the oxidizing agent is added to the first mixture in an amount of less than about 0.5 wt. % based on the amount of the second mixture.

The method according to the present invention further comprises the step of applying pressure and current to the second mixture, comprising the oxidizing agent, the phosphor material and the powder of glass components. The application of pressure and current leads to a sintering of the components of the second mixture. During the sintering of the components the powder of glass components melts and leads to a preferably transparent melt in which the phosphor material is preferably homogeneously mixed.

The method of the present invention is preferably a so-called SPS method. The sintering temperature in the SPS method is much lower compared to further methods of the prior art, wherein glasses are heated to a high temperature so that they soften or melt. The lower sintering temperature reduces the potential damage to phosphors, while keeping the porosity low by using a pressure sintering process.

The pressure applied to the second mixture might be at least about 30 MPa, preferably at least about 40 MPa, more preferred at least about 50 MPa.

In addition to the pressure current is applied in the method of the present invention. In a so-called SPS method, pressure is applied to the graphite die containing the second mixture. The application of current leads to an increase of the temperature in the second mixture. The applied currents are normally hundreds of Amperes depending on the target sintering temperature. Preferably the applied currents are up to 1500 A.

In an embodiment, an inert atmosphere is applied in the method according to the present invention. Preferably, in the case of a SPS method, the inert atmosphere is applied to the SPS furnace chamber, comprising the second mixture. In other words, the present atmosphere, which typically comprises oxygen, is replaced with an inert atmosphere. Typical inert atmospheres are nitrogen or argon, wherein nitrogen is preferred.

Preferably, the glass composite wavelength converter has a quantum efficiency of at least about 80%. In an embodiment, the glass composite wavelength converter has a quantum efficiency of at least about 90%. In a preferred embodiment, the glass composite wavelength converter has a quantum efficiency of at least about 95%.

It is a further object of the present invention to provide a glass composite wavelength converter prepared by a method according to the present invention.

The phosphor material, the glass components and the oxidizing agents correspond to the respective components and materials as mentioned above.

E.g., the phosphor material of the glass composite wavelength converter is YAG:Ce.

In an embodiment, the glass components of the glass wavelength converter are selected from $RO—B_2O_3—Al_2O_3—SiO_2$, wherein R is selected from alkali earth metals Mg, Ca, Sr and Ba.

Figure 5:
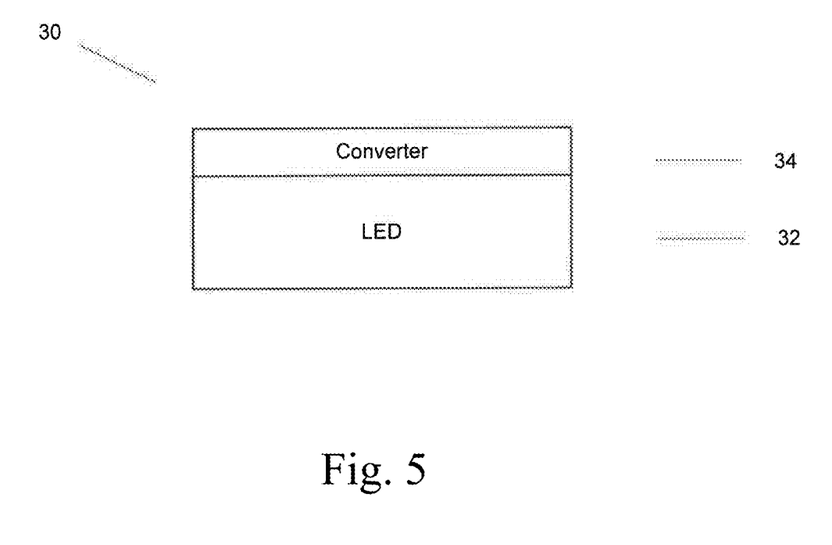
FIG. 5 represents a light source

It is a further object of the present invention to provide a light source 30, as shown in FIG. 5, comprising:
a light emitting diode (LED) 32 that emits a primary light; and
a glass composite wavelength converter 34 prepared by a method comprising the steps of:
providing at least one phosphor material,
providing a powder of glass components,
mixing the phosphor material and the powder of glass components, thereby preparing a first mixture,
adding at least one oxidizing agent to the first mixture,
mixing the oxidizing agent with the first mixture, thereby preparing a second mixture,
applying pressure and current to the second mixture,
thereby preparing a glass composite wavelength converter,
wherein the phosphor material converts at least a portion of the primary light into a secondary light.

A light emitting diode (LED) of a light source of the present invention typically emits blue light or UV light. Preferred LEDs are blue light LEDs.

The components of the glass composite wavelength converter and the method steps correspond to the components and steps as described above.

In an embodiment, the phosphor material of the light source is YAG:Ce.

In a further embodiment, the oxidizing agent of the light source is $NaNO_3$.

The glass composite wavelength converter of the light source has a quantum efficiency of at least about 80%, preferably of at least about 90%, more preferred of at least about 95%.

The glass composite wavelength converters as well as the light sources may be applied in general lighting, automotive lighting, projection lighting, etc.

FIG. 1*a*-1*e* show different glasses made by SPS.

Figure 1A:
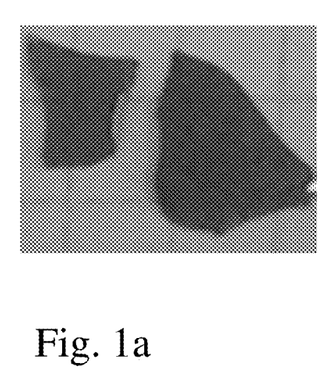
FIGS. 1a-1e represent glass samples prepared by SPS.

FIG. 1*a* is a $TeO_2$ glass, prepared at a temperature of 300° C. and a pressure of 50 MPa (the temperature and the pressure are retained for less than 1 minute).

Figure 1B:
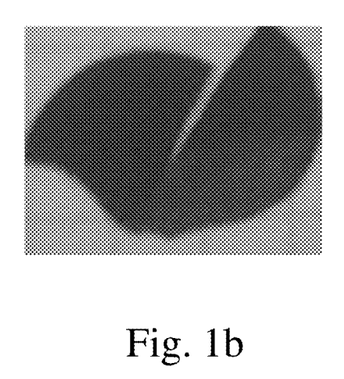

FIG. 1*b* is a $PbO—ZnO—B_2O_3$ glass prepared at a temperature of 350° C. and a pressure of 50 MPa (the temperature and the pressure are retained for 5 minutes).

Figure 1C:
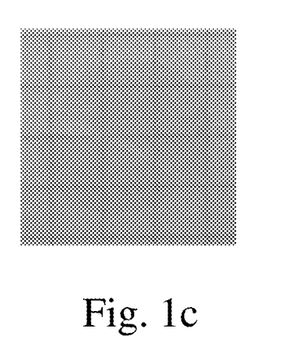

FIG. 1*c* is a soda-lime glass prepared at a temperature of 480° C. and a pressure of 50 MPa (the temperature and the pressure are retained for 1 minute).

Figure 1D:
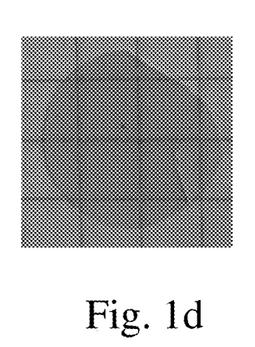

FIG. 1d is an alkaline-earth aluminosilicate glass (Schott 8252) prepared with SPS at a temperature of 610° C. at a pressure of 50 MPa (the temperature and pressure are retained for less than 1 minute).

Figure 1E:
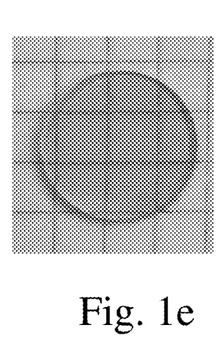

FIG. 1e is a Borosilicate glass (Borofloat33) prepared with SPS at a temperature of 600° C. at a pressure of 50 MPa (the temperature and pressure are retained for 0.5 minutes).

In FIGS. 1a to 1e the degree of darkening is obviously different and it seems to be dependent on the glass composition. Some glasses containing tellurium and lead become black by SPS (FIGS. 1a and 1b). The metal ions in the glass might be reduced to metal elements by CO during SPS sintering, which could cause the darkening.

From the degree of darkening from above glasses shown in FIG. 1a to 1e, it implies that direct contact with graphite die cannot be the major reason for the darkening in the glass. The reduced atmosphere containing CO is a further cause for the darkening. When making PiG samples, any darkening in the glass matrix will absorb the light and thus reduce PiG efficacy.

Figure 2A:
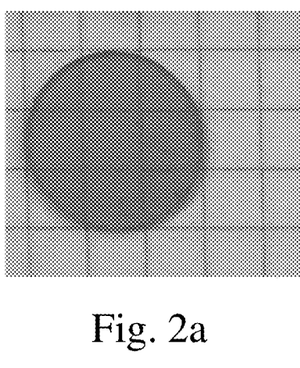
FIGS. 2a-2c represent glass samples prepared by SPS.
Figure 2B:
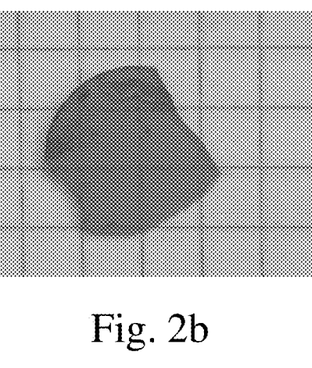
Figure 2C:
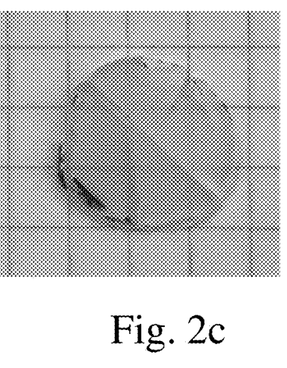

FIGS. 2a-2c show alkaline-earth boroaluminosilicate (Ca, Ba)O—$B_2O_3$—$Al_2O_3$—$SiO_2$ glasses.

FIGS. 2a and 2b represent glasses which were sintered by SPS without the addition of $NaNO_3$.

FIG. 2c represent a glass prepared by SPS according to FIGS. 2a and 2b, however with the addition of 1 wt % $NaNO_3$ fine powder.

It is clearly shown that glass 2c with a $NaNO_3$ additive has a much reduced darkening. The $NaNO_3$ can be decomposed during SPS sintering as described above. The example here shows the effect of $NaNO_3$ on the reduction of the darkening in glass made by SPS process.

PiG samples using YAG:Ce phosphor in alkaline-earth boroaluminosilicate glass, with and without the addition of $NaNO_3$ in the phosphor glass powder mixture were prepared by a SPS process and were tested. Table 1 lists three PiG samples from this test. Sample A has no $NaNO_3$ addition, while samples B and C have each 1 wt. % $NaNO_3$ added into the phosphor powder mixture. "v %" refers to volume-% with respect to the total volume of the second mixture. "D" represents the density of the glass composite wavelength converter. Cx and Cy indicate the color measured with a blue LED as an excitation source. "QE" represents the quantum efficiency measured at 460 nm. "Abs" represents the absorption at 700 nm. The last column of Table 1 indicates the conditions for the SPS, like the temperature, the pressure and the holding time of these conditions.

increased to 95.4% and 96.1% respectively, and their absorptions are reduced to 2.1% and 1.7% respectively. The conversion efficacy also shows an improvement compared to a sample without the addition of $NaNO_3$.

EXAMPLES

Sample 1: Phosphor in Glass (PiG) Sample A (without $NaNO_3$):

1.7 gram of glass powder, which is one type of alkali earth boroaluminosilicate glass, 30.3 mol-% (BaO,ZnO,CaO)-5.6 mol-% $B_2O_3$-4.0 mol-% $Al_2O_3$-60.2 mol-% $SiO_2$, was mixed with 0.4 gram of phosphor powder (which is one type of YAG:Ce phosphor) manually in an agate mortar and pestle. The powder mixture was further mixed in a plastic jar in Thinky Mixer ARE-500 at 1000 rpm by two minutes. 0.7 grams of mixed powder was transferred into a graphite die with 15 mm inner diameter. The samples are sintered by SPS Syntex Inc's Dr. Sinter LAB SPS furnace, model SPS515 with a maximum force 50 kN and a maximum current of 1500 A. The sample was sintered under $N_2$ atmosphere. The sample was sintered at a peak temperature of 570° C. with one minute holding time and with an applied pressure of 65 MPa.

The sintered PiG disc was sliced and ground and lapped down to a thickness of about 126 μm.

Sample 2: Phosphor in Glass (PiG) Sample C (with $NaNO_3$):

1.7 gram of glass powder, which is one type of alkali earth boroaluminosilicate glass, 30.3 mol-% (BaO,ZnO,CaO)-5.6 mol-% $B_2O_3$-4.0 mol-% $Al_2O_3$-60.2 mol-% $SiO_2$, was mixed with 0.4 gram of phosphor powder (which is one type of YAG:Ce phosphor), and 0.021 gram of $NaNO_3$ manually in an agate mortar and pestle. The powder mixture was further mixed in a plastic jar by Thinky Mixer ARE-500 at 1000 rpm by two minutes. 0.7 grams of mixed powder was transferred into a graphite die with 15 mm inner diameter. The sample was sintered by the same SPS furnace as in Example 1. The sample was sintered under $N_2$ atmosphere. The sample was sintered at a peak temperature of 583° C. with a few seconds holding time and with an applied pressure of 50 MPa.

The sintered PiG disc was sliced and ground and lapped down to an average thickness of about 125 μm.

As can be seen with the use of an oxidizing agent, the darkening in phosphor in glass samples can be significantly

TABLE 1

| Sample ID | Phosphor | Thickness (μm) | D (g/cc) | Cx | Cy | Conversion efficacy (lm/w) | Quantaurus QE @460 nm | Quantaurus Abs. @700 nm | SPS Cond. (° C./min/MPa) |
|---|---|---|---|---|---|---|---|---|---|
| A | YAG:Ce 19 wt. % (13.6 v %) | 126 | 3.24 | 0.2776 | 0.2525 | 118.6 | 78.8% | 11.8% | 570/1/65 |
| B | YAG:Ce 16.79 wt. % (11.8 v %) | 121 | 3.19 | 0.2495 | 0.1990 | 123.8 | 95.4% | 2.1% | 600/0.5/50 |
| C | YAG:Ce 19 wt. % (13.6 v %) | 116-133 | 3.21 | 0.2707 | 0.2416 | 131.2 | 86.1% | 1.7% | 583/~0.1/50 |

Figure 3A:
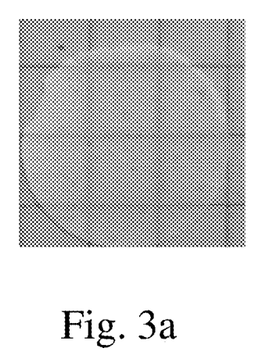
FIGS. 3a-3c represent phosphor-in-glass samples prepared by SPS.
Figure 3B:
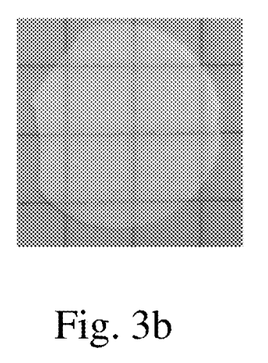
Figure 3C:
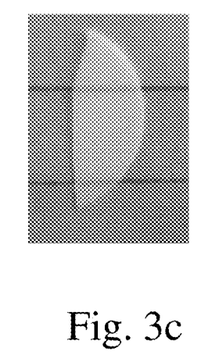

FIG. 3a-3c show the PiG examples prepared with and without the addition of $NaNO_3$ as oxidizing agent according to Table 1. In FIG. 3a (Sample A) the sample's color is a little darker while samples B (FIG. 3b) and C (FIG. 3c) have a more bright yellow color. The quantum efficiency at 460 nm of sample A is only 78.8% and the absorption at 700 nm is 11.8%. The quantum efficiency of samples B and C are reduced and the performance, such as the efficiency of the phosphor in glass samples and therefore of the glass composite wavelength converters can be increased.

While there have been shown and described what are at present considered to be preferred embodiments of the invention, it will be apparent to those skilled in the art that various changes and modifications can be made herein without departing from the scope of the invention as defined by the appended claims. The disclosure rather comprises any new feature as well as any combination of features, which in particular includes any combination of features in the appended claims, even if the feature or combination is not per se explicitly indicated in the claims or the examples.

What is claimed is:

1. A method for preparing a glass composite wavelength converter, the method comprising:
    providing at least one phosphor material;
    providing a powder of glass components;
    mixing the phosphor material and the powder of glass components, thereby preparing a first mixture;
    adding at least one oxidizing agent to the first mixture;
    mixing the oxidizing agent with the first mixture, thereby preparing a second mixture; and
    applying pressure and current to the second mixture, thereby preparing the glass composite wavelength converter.

2. The method of claim 1, wherein the phosphor material is YAG:Ce.

3. The method of claim 1, wherein the glass components have a glass transition temperature of less than about 600° C.

4. The method of claim 1, wherein the glass components have a glass transition temperature of less than about 400° C.

5. The method of claim 1, wherein the glass components comprise $RO-B_2O_3-Al_2O_3-SiO_2$, and wherein R is selected from the group consisting of alkali earth metals, Mg, Ca, Sr and Ba.

6. The method of claim 1, wherein the oxidizing agent is selected from the group consisting of $NaNO_3$, $LNO_3$, $LiNO_3$, $Na_2SO_3$, $K_2SO_3$, $LiSO_3$ $Li_2SO_3$, and $K_2MnO_4$.

7. The method of claim 1, wherein the oxidizing agent is added in an amount of less than about 3 wt. % based on an amount of the second mixture.

8. The method of claim 1, wherein the oxidizing agent is added in an amount of less than about 2 wt. % based on an amount of the second mixture.

9. The method of claim 1, wherein the oxidizing agent is added in an amount of less than about 1 wt. % based on an amount of the second mixture.

10. The method of claim 1, wherein the phosphor material is YAG:Ce and the glass components comprise $RO-B_2O_3-Al_2O_3-SiO_2$, and wherein R is selected from the group consisting of alkali earth metals Mg, Ca, Sr and Ba.

11. The method of claim 1, further comprising applying an inert atmosphere to the second mixture.

12. The method of claim 1, wherein the pressure is at least about 30 MPa.

13. The method of claim 1, wherein the glass composite wavelength converter has a quantum efficiency of at least about 80%.

14. The glass composite wavelength converter prepared according to the method of claim 1.

15. The glass composite wavelength converter of claim 14, wherein the phosphor material is YAG:Ce.

16. The glass composite wavelength converter of claim 14, wherein the glass components comprise $RO-B_2O_3-Al_2O_3-SiO_2$, and wherein R is selected from the group consisting of alkali earth metals, Mg, Ca, Sr and Ba.

17. A light source comprising:
    a light emitting diode (LED) configured to emit a primary light; and
    a glass composite wavelength converter prepared according to the following method:
        providing at least one phosphor material;
        providing a powder of glass components;
        mixing the phosphor material and the powder of glass components, thereby preparing a first mixture;
        adding at least one oxidizing agent to the first mixture;
        mixing the oxidizing agent with the first mixture, thereby preparing a second mixture; and
        applying pressure and current to the second mixture, thereby preparing the glass composite wavelength converter,
    wherein the phosphor material is configured to convert at least a portion of the primary light into a secondary light.

18. The light source of claim 17, wherein the phosphor material is YAG:Ce.

19. The light source of claim 17, wherein the oxidizing agent is $NaNO_3$.

20. The light source of claim 17, wherein the glass composite wavelength converter has a quantum efficiency of at least about 80%.

* * * * *